(12) United States Patent
Grice

(10) Patent No.: US 11,747,379 B2
(45) Date of Patent: Sep. 5, 2023

(54) ACTIVE MEASUREMENT CORRECTION OF RESISTIVE SENSORS

(71) Applicant: Renesas Electronics America Inc., Milpitas, CA (US)

(72) Inventor: David Mitchell Grice, Spirit Lake, ID (US)

(73) Assignee: Renesas Electronics America, Inc., Milpitas, CA (US)

( * ) Notice: Subject to any disclaimer, the term of this patent is extended or adjusted under 35 U.S.C. 154(b) by 0 days.

(21) Appl. No.: 17/592,934

(22) Filed: Feb. 4, 2022

(65) Prior Publication Data

US 2022/0291267 A1 Sep. 15, 2022

Related U.S. Application Data

(60) Provisional application No. 63/158,963, filed on Mar. 10, 2021.

(51) Int. Cl.
*G01R 27/26* (2006.01)
*G01R 35/00* (2006.01)

(52) U.S. Cl.
CPC ....... *G01R 27/2629* (2013.01); *G01R 35/005* (2013.01)

(58) Field of Classification Search
CPC . G01R 27/2629; G01R 35/005; G01L 1/2268; G01L 1/2281; G01L 19/0092; G01D 3/022; G01D 3/024; G01D 3/021
USPC ......................................................... 324/601
See application file for complete search history.

(56) References Cited

U.S. PATENT DOCUMENTS

| 5,866,821 | A | 2/1999 | Raynes |
| 2004/0190592 | A1 | 9/2004 | Lojen |
| 2007/0159293 | A1* | 7/2007 | Landsberger ........... H01L 28/20 257/E27.047 |
| 2013/0106440 | A1* | 5/2013 | Brunner ................. G01R 21/12 324/629 |
| 2014/0024956 | A1 | 1/2014 | Purdy et al. |
| 2015/0133781 | A1 | 5/2015 | Conero |
| 2019/0128747 | A1* | 5/2019 | Hikosaka ................. G01K 7/20 |

FOREIGN PATENT DOCUMENTS

| EP | 1625372 A1 | 2/2006 |
| WO | 2020263175 A1 | 12/2020 |

OTHER PUBLICATIONS

EP Search and Opinion dated Jul. 6, 2022 received in EP Patent Application No. 22156990.8.

* cited by examiner

*Primary Examiner* — Farhana A Hoque
(74) *Attorney, Agent, or Firm* — SCULLY, SCOTT, MURPHY & PRESSER, P.C.

(57) ABSTRACT

In an embodiment, an apparatus is disclosed that comprises a plurality of resistors arranged as a reverse bridge and configured to convert an input voltage to a scaled output voltage. The scaled output voltage is scaled to a target format based at least in part on a range of the input voltage and a fixed value of the plurality of resistors. The input voltage is generated based at least in part on at least one signal generated by a sensor based at least in part on a measurement of a property of a measurement target. At least one of the plurality of resistors has a resistance value of R and at least another of the plurality of resistors has a resistance value of R plus or minus ΔR.

19 Claims, 5 Drawing Sheets

ACTIVE MEASUREMENT CORRECTION OF RESISTIVE SENSORS

CROSS-REFERENCE TO RELATED APPLICATION

This application claims the benefit of U.S. Provisional Application Ser. No. 63/158,963 filed on Mar. 10, 2021, the entire content of which is incorporated herein by reference.

BACKGROUND OF THE SPECIFICATION

The present disclosure relates in general to apparatuses and methods for active measurement correction of resistive sensors.

Resistive sensors are often utilized to measure the properties of various measurement targets including pressure, temperature, strain or other properties. One example of a resistive sensor is a bridge arrangement. In a bridge arrangement, resistors are connected between a supply voltage and ground. As an example, the bridge arrangement may comprise two pairs of resistors disposed in parallel between the supply voltage and ground where each of the pairs comprises two resistors connected in serial between the supply voltage and ground. The connection nodes between the resistors in each pair serve as outputs for the bridge arrangement where the differential voltage between the outputs of the connection nodes corresponds to the measurement of the property of the particular measurement target that is being measured. In such a resistive sensor, the value of one or more of the resistors may vary based on changes in the property being measured which in turn changes the voltage output by the corresponding connection node.

SUMMARY

In an embodiment, an apparatus is disclosed that comprises a plurality of resistors arranged as a reverse bridge and configured to convert an input voltage to a scaled output voltage. The scaled output voltage is scaled to a target format based at least in part on a range of the input voltage and a fixed value of the plurality of resistors. The input voltage is generated based at least in part on at least one signal generated by a sensor based at least in part on a measurement of a property of a measurement target. At least one of the plurality of resistors has a resistance value of R and at least another of the plurality of resistors has a resistance value of R plus or minus ΔR.

In another embodiment, a system is disclosed that comprises a sensor signal conditioning integrated circuit. The sensor signal conditioning integrated circuit is configured to receive at least a first sensor signal and a second sensor signal from a sensor. The first and second sensor signals are generated by the sensor based at least in part on a measurement of a property of a measurement target. The sensor signal conditioning integrated circuit is further configured to generate an input voltage based at least in part on a differential voltage between the first and second sensor signals. The input voltage has a range that is proportional to a measurement range the property of the measurement target that is being measured by the sensor. The system further comprises a plurality of resistors arranged as a reverse bridge. The reverse bridge is configured to convert the input voltage to a scaled output voltage. The scaled output voltage is scaled to a target format based at least in part on the range of the input voltage and a fixed value of the plurality of resistors.

In another embodiment, a system is disclosed that comprises a sensor signal conditioning integrated circuit. The sensor signal conditioning integrated circuit is configured to receive at least a first sensor signal and a second sensor signal from a sensor. The first and second sensor signals are generated by the sensor based at least in part on a measurement of a fluid pressure corresponding to a pressure monitor of a patient. The sensor signal conditioning integrated circuit is further configured to generate an input voltage based at least in part on a differential voltage between the first and second sensor signals. The input voltage has a range that is proportional to a measurement range of the fluid pressure that is being measured by the sensor. The system further comprises a plurality of resistors arranged as a reverse bridge. The reverse bridge is configured to convert the input voltage to a scaled output voltage. The scaled output voltage is scaled to a target format based at least in part on the range of the input voltage and a fixed value of the plurality of resistors. The reverse bridge being further configured to provide the scaled output voltage to a presentation device.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Resistive sensors are often utilized to measure the properties of various measurement targets including pressure, temperature, strain or other properties. One example of a resistive sensor is a bridge arrangement. In a bridge arrangement, resistors are connected between a supply voltage and ground. As an example, the bridge arrangement may comprise two pairs of resistors disposed in parallel between the supply voltage and ground where each of the pairs comprises two resistors connected in serial between the supply voltage and ground. The connection nodes between the resistors in each pair serve as outputs for the bridge arrangement where the differential voltage between the outputs of the connection nodes corresponds to the measurement of the property of the particular measurement target that is being measured. In such a resistive sensor, the value of one or more of the resistors may vary based on changes in the property being measured which in turn changes the voltage output by the corresponding connection node.

Often, such resistive sensors output directly to a presentation device that is configured to present the measurement to a user based on the differential voltage between the outputs of each of the connection nodes. The differential voltage is often provided to the presentation device in a particular format that is acceptable to the presentation device. For example, in a system where fluid pressure is being measured, the resistive sensor may output a differential voltage between the connection nodes in microvolts ($\mu$V), millivolts (mV), or another voltage value that is scaled proportionately to a supply voltage known and controlled by the presentation device to provide the presentation device with a value in $\mu$V per supply voltage value per mmHg ($\mu$V/volts (V)/mmHg). As an example, the presentation device may be configured to utilize a scaled differential voltage in 5 $\mu$V/V/mmHg, 40 $\mu$V/V/mmHg or another format. While voltage values are described herein with reference to $\mu$V, mV and V, any other units of voltage may be utilized in other embodiments.

In order to ensure that the resistive sensor is configured to output an accurate differential voltage, the resistive sensor is often trimmed for the particular use case. For example, the resistors of a fluid pressure sensor may be trimmed, e.g., using laser trimming, such that the differential voltage is 0 $\mu$V/V at 0 mmHg of pressure and 1500 $\mu$V/V at 300 mmHg. However such trimming may be expensive on a case by case basis and may not be fully effective in a case where the resistance of one or more of the resistors varies due to parameters other than the property being measured.

Figure 1:
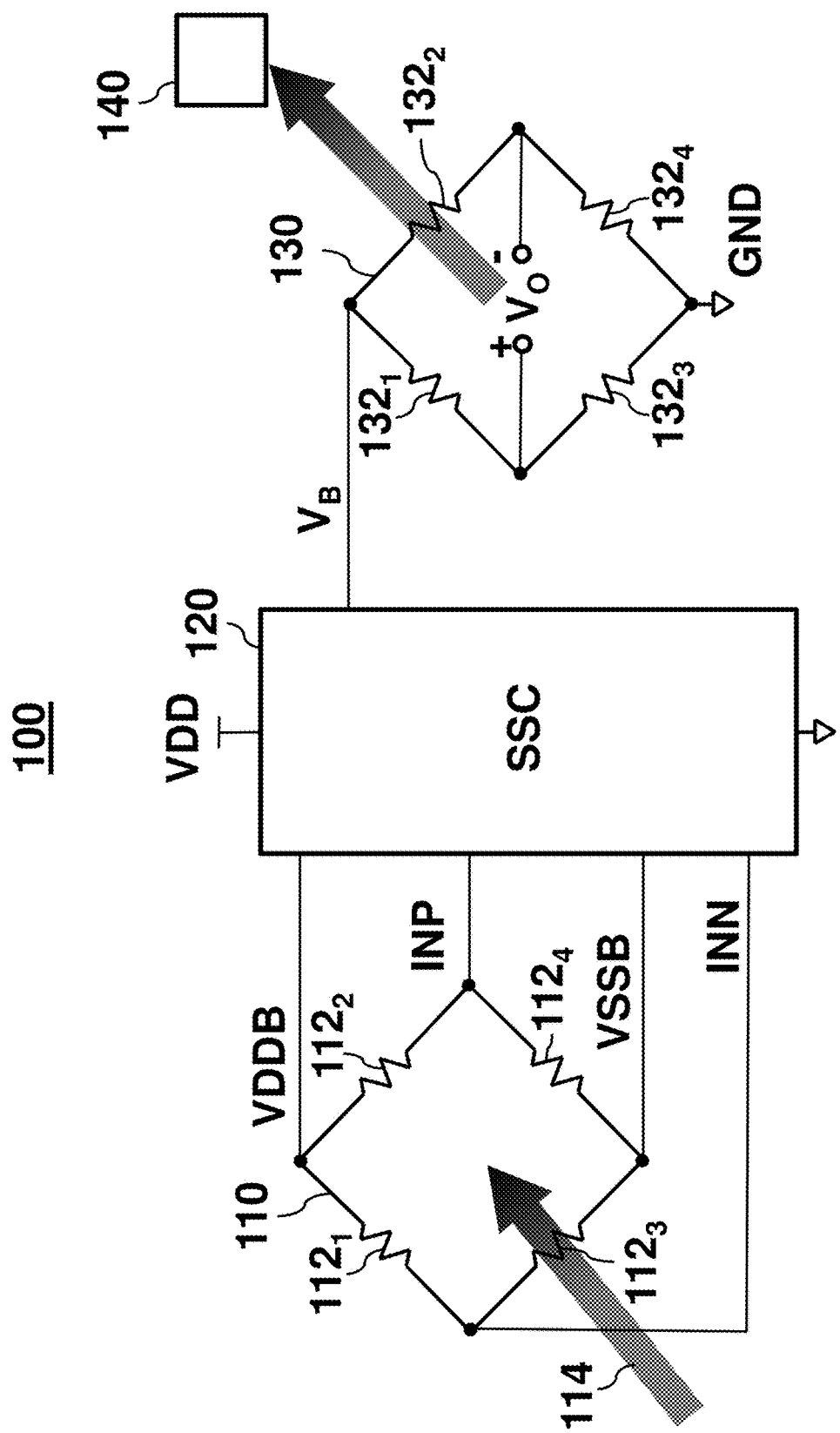
FIG. 1 is a block diagram of an example system for active measurement correction of resistive sensors according to an embodiment.

With reference to FIG. 1, a system 100 according to an illustrative embodiment is illustrated. System 100 comprises a sensor 110 such as the resistive sensor described above, a sensor signal conditioner integrated circuit (SSC) 120, a reverse bridge 130 and a presentation device 140 such as, e.g., a patient monitor. System 100 is configured to condition the differential voltage output by sensor 110 and to generate a voltage output $V_O$ at reverse bridge 130 that has the same format that presentation device 140 would receive directly from a resistive sensor without requiring the resistors of sensor 110 to be trimmed to specific values.

Sensor 110 comprises a resistive sensor such as that described above and is configured to measure a property of a measurement target 114 such as, e.g., pressure, temperature, strain, force, displacement, torque, light intensity, acceleration or any other property of measurement target 114. As an example, measurement target 114 may comprise a fluid, solid or any other measurement target 114 that has a property that may be measured by a resistive sensor. For example, in an illustrative embodiment, sensor 110 may be configured to measure fluid pressure corresponding to an invasive blood pressure (IBP) monitor that is inserted intravenously into the heart of a patient. Other measurement targets 114 and properties may alternatively be measured by sensor 110.

In an illustrative embodiment, sensor 110 is configured in a bridge arrangement comprising resistors $112_1$, $112_2$, $112_3$ and $112_4$ arranged between a positive bridge supply voltage (VDDB) and a bridge ground (VSSB). In some embodiments, VDDB and VSSB connections are provided to sensor 110 by SSC 120. In other embodiments, one or both of VDDB and VSSB may be provided to sensor 110 from another source. In some embodiments, sensor 110 may alternatively be configured in a half-bridge or other arrangement.

In the bridge arrangement, resistors $112_1$ and $112_3$ may be connected in a serial arrangement between VDDB and VSSB, resistors $112_2$ and $112_4$ may be connected in a serial arrangement between VDDB and VSSB and resistors $112_1$ and $112_3$ may be connected in parallel to resistors $112_2$ and $112_4$ between VDDB and VSSB. The connection node between resistor $112_1$ and resistor $112_3$ can provide a negative sensor bridge signal INN to SSC 120 and the connection node between resistor $112_2$ and resistor $112_4$ can provide a positive sensor bridge signal INP to SSC 120 although in some embodiments the connection nodes for INN and INP may be reversed.

Sensor 110 generates the INP and INN signals based on the values of VDDB and VSSB and the values of resistors $112_1$, $112_2$, $112_3$ and $112_4$. For example, one or more of the resistors $112_1$, $112_2$, $112_3$ and $112_4$ may be configured to change its resistance based on changes in the particular property of the measurement target 114 that is being measured. This change in resistance will result in a corresponding change in the value of the connected output signal INP or INN that is provided to SSC 120. For example, if sensor 110 is configured as a pressure sensor, one or more of resistors $112_1$, $112_2$, $112_3$ and $112_4$ may be configured to change its resistance as pressure changes in a fluid exposed to sensor 110. In the example of an invasive blood pressure monitoring system, sensor 110 may be exposed to a fluid whose pressure changes as blood pressure changes in the body of a patient, e.g., in the heart. The changes in pressure are then measured by sensor 110 due to corresponding changes in the resistance of one or more of resistors $112_1$, $112_2$, $112_3$ and $112_4$ and corresponding signals INP and INN are output to SSC 120. For example, the differential voltage between INP and INN may be in $\mu$V, mV or another voltage unit. In some cases, where the differential voltage is provided directly to presentation device 140, the differential voltage may be scaled to a format of 5 $\mu$V/mmHg, 40 $\mu$V/V/mmHg or another format. In some embodiments, other properties of measurement target 114 may be measured in a similar manner or other units may be utilized instead of mmHg such as, e.g., PSI, kPa, Bars or other measures of pressure. In some cases, the differential voltage may be non-linear and also vary due to changes in properties other than the property being measured, such as, e.g., temperature in the case where pressure is being measured.

SSC 120 comprises an integrated circuit that is configured to perform signal conditioning including gain amplification, linearization, digitization and sensor-specific correction of resistive sensor signals such as INP and INN. SSC 120 is suitable for use with bridge and half-bridge sensors, as well as external voltage source element and single-element sensors, diodes or other resistive sensors.

In an illustrative embodiment, SSC 120 is configured to perform digital compensation of the sensor offset, sensitivity, temperature drift and non-linearity using circuitry such as, e.g., a math core, that is configured to implement and run a correction algorithm with calibration coefficients stored in a non-volatile reprogrammable memory. SSC 120 is also configured to generate measurement value readouts and programming capabilities via interfaces such as, e.g., an Inter-Integrated Circuit, I-squared-C (I2C) interface, a serial peripheral interface (SPI), a one-wire interface (OWI) or any other interfaces. In other embodiments, SSC 120 may comprise any other circuitry that is configured to condition a signal received from sensor 110 or perform other operations on the signal. For example, in addition to signal conditioning, SSC 120 may perform additional functions such as sensor diagnostics, error detection, and data authentication.

SSC 120 is connected to a supply voltage VDD and is configured to provide VDDB based at least in part on VDD to sensor 110. For example, VDDB may have the same value as VDD or may have a value generated based on VDD. In some embodiments, VDD comprises a voltage value in a range of about 3.3V to 5V. In other embodiments, VDD may comprise any other voltage value including voltage values that are greater than 5V or smaller than 3.3V. SSC 120 also has a connection to ground and is configured to provide VSSB to sensor 110 based at least in part on the connection to ground. In some embodiments, VSSB may have a value that is not equal to ground, e.g., a value greater than ground but smaller than a maximum value or even a negative value. In some embodiments, the maximum value of VSSB may be 0.7V although other maximum values may alternatively be used. In other embodiments, the voltage of sensor 110 may be derived from a current source generated internally to SSC 120.

SSC 120 receives INP and INN as input signals from sensor 110, e.g., analog signals, and is configured to perform various operations or algorithms using INP, INN and VDD to generate a voltage $V_B$ that represents precisely and deterministically the property of measurement target 114 that is being measured. For example, INP and INN values that correspond to the property of measurement target 114 may be output by sensor 110 to SSC 120, e.g., based on VDDB, VSSB and the resistance values of resistors 112₁, 112₂, 112₃ and 112₄, some or all of which may be configured to change based on changes in the property of measurement target 114. The differential voltage between INP and INN is scaled and corrected by SSC 120 to create a calibrated output scale that corresponds to the corresponding property of measurement target 114.

As an example, the one or more algorithms or operations may be performed on the differential voltage between INP and INN to generate $V_B$ including, e.g., gain to increase the signal range, linearization, temperature compensation and correction or any other operation as needed. As an example, the differential voltage between INP and INN may have a value in μV or mV while $V_B$ may have a value in V. The differential voltage between INP and INN may be gained from μV or mV to V to increase the signal range, and linearization, temperature compensation and correction or other operations may be performed on the gained value to generate $V_B$. While described with reference to μV, mV and V, any other unit of voltage may alternatively be utilized for each value. SSC 120 is configured to generate $V_B$ such that $V_B$ corresponds to a percentage of VDD, e.g., 0% to 100% of VDD, another percentage range corresponding to VDD or to an absolute voltage range independent of VDD. In some embodiments, the range of $V_B$ as a percentage of VDD is configured to be proportional the range of the property of measurement target 114.

In one example, the property of measurement target 114 may be fluid pressure where the measurement target 114 is a fluid. For example, the fluid pressure may range from 0 mmHg to 300 mmHg at sensor 110. As the fluid pressure changes between 0 mmHg and 300 mmHg, the value of one or more of resistors 112₁, 112₂, 112₃ and 112₄ will also change, depending on the particular bridge configuration, resulting in a change in one or both of INP and INN. SSC 120 applies a gain and other corrective factors to the differential voltage between INP and INN and generates $V_B$. For example, where VDD is 5 V, a fluid pressure of 0 mmHg may correspond to a $V_B$ of 0 V, i.e., 0% VDD, while a fluid pressure of 300 mmHg may correspond to a $V_B$ of 5 V, i.e., 100% VDD. Other percentages of VDD may be utilized by SSC 120 to correspond to the range of fluid pressure in other embodiments.

In a more specific example, if VDDB for a particular bridge configuration has a value of 1.7 V, a maximum difference span between INP and INN for the bridge configuration may be approximately 2.8 mV at 330 mmHg. Using a maximum gain of 540, the span will be scaled to about 1.5 V. SSC 120 is calibrated such that the span of 1.5 V produces voltage $V_B$ with a range of 0% VDD to 100% VDD. The operation of SSC 120 and the properties of reverse bridge 130 together are configured to translate an arbitrary, temperature-dependent sensitivity of sensor 110 in μV/mmHg or mV/mmHg into a precisely defined voltage, $V_O$, that is ratiometric to VDD with a scaling factor in μV/V/mmHg or mV/V/mmHg in accordance with the expected format for presentation device 140. In some embodiments, the voltage VDD may be established or controlled by the presentation device 140.

In an illustrative embodiment, reverse bridge 130 is configured in a bridge arrangement comprising resistors 132₁, 132₂, 132₃ and 132₄ arranged between $V_B$ and ground (GND) where $V_B$ is provided to reverse bridge 130 by SSC 120. In some embodiments, reverse bridge 130 may alternatively be configured in a half-bridge or other arrangement. For example, reverse bridge 130 may be configured in an arrangement that corresponds to the arrangement of sensor 110, e.g., bridge for bridge, half bridge for half bridge, etc. In some embodiments, reverse bridge 130 may be implemented as a thin-film or thick-film hybrid, as a microelectromechanical system (MEMS), integrated into SSC 120 or implemented in any other manner. In some embodiments, reverse bridge 130 may be manufactured insensitive to temperature where, for example the resistance values of each of 132₁, 132₂, 132₃ and 132₄ may change together with temperature such that the resistance ratios stay the same.

In the bridge arrangement of reverse bridge 130, resistors 132₁ and 132₃ are connected in a serial arrangement between $V_B$ and GND and resistors 132₂ and 132₄ are connected in a serial arrangement between $V_B$ and GND. The pair of resistors 132₁ and 132₃ are also connected in a parallel arrangement to the pair of resistors 132₂ and 132₄ between $V_B$ and GND. The connection node between resistor 132₁ and resistor 132₃ can provide a positive signal to an output $V_O$, e.g., the output to the presentation device, and the connection node between resistor 132₂ and resistor 132₄ can provide a negative signal to $V_O$ although in some embodiments the connection nodes for the positive and negative signals may be reversed.

Reverse bridge 130 generates the positive and negative signals for $V_O$ based on the values of $V_B$ and GND and the values of resistors 132₁, 132₂, 132₃ and 132₄. In the case of reverse bridge 130, the resistance values of resistors 132₁, 132₂, 132₃ and 132₄ are held fixed while $V_B$ changes according to changes in the property of measurement target 114 as sensed by sensor 110. For example, where $V_B$ has a range from 0% VDD to 100% VDD, the resistances of resistors 132₁, 132₂, 132₃ and 132₄ may be tuned in advance to specifically output $V_O$ with a particular format that is expected by the presentation device for the range of 0% VDD to 100% VDD since the range of $V_B$ is known.

Figure 2:
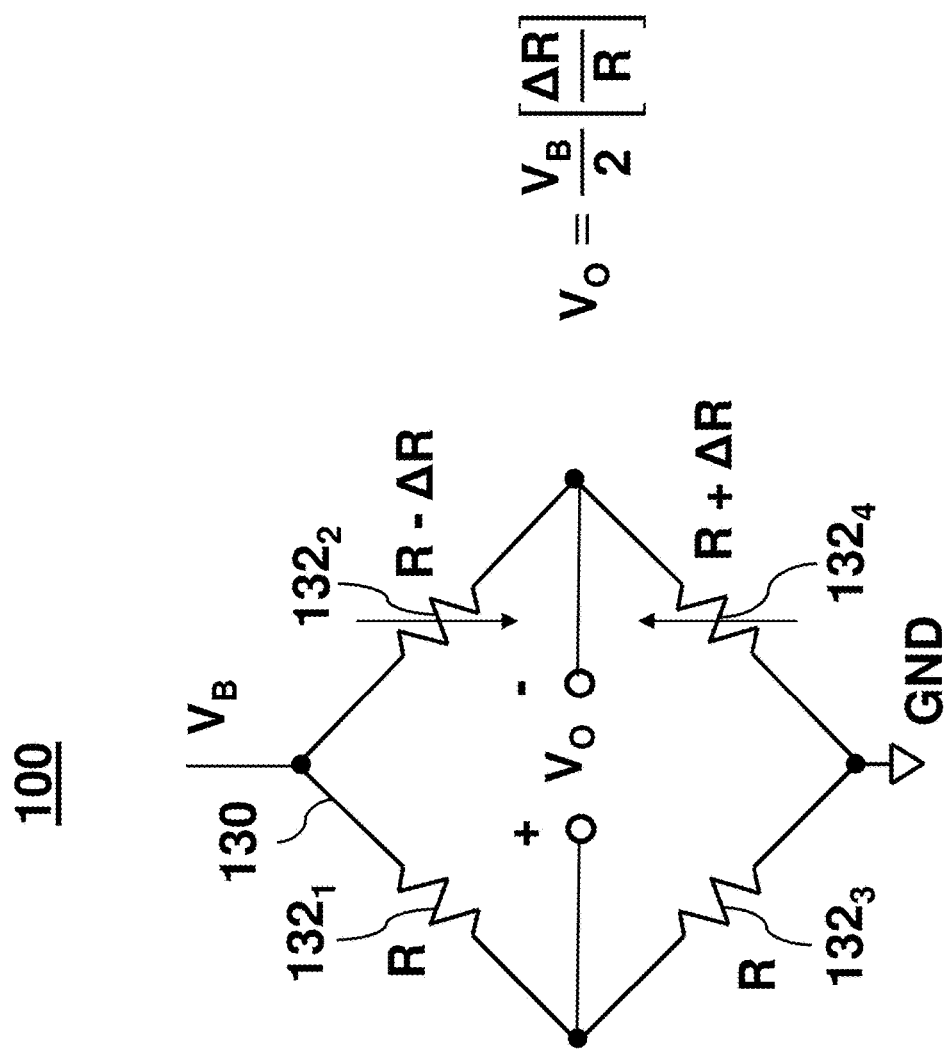
FIG. 2 is a circuit diagram illustrating an example reverse bridge of the example system of FIG. 1 according to a first embodiment.

With reference now to FIG. 2, in one embodiment of reverse bridge 130, a bridge arrangement may be utilized in which the resistance of resistor 132₁ is R, the resistance of resistor 132₂ is R−ΔR, the resistance of resistor 132₃ is R and the resistance of resistor 132₄ is R+ΔR. In this embodiment, $V_O$ may be determined according to equation (1) below:

$$V_O = \frac{V_B}{2}\left[\frac{\Delta R}{R}\right] \quad (1)$$

As seen in equation (1), as $V_B$ changes, the output $V_O$ also changes while resistance R and ΔR are held constant with a fixed ratio of ΔR/R.

Figure 3:
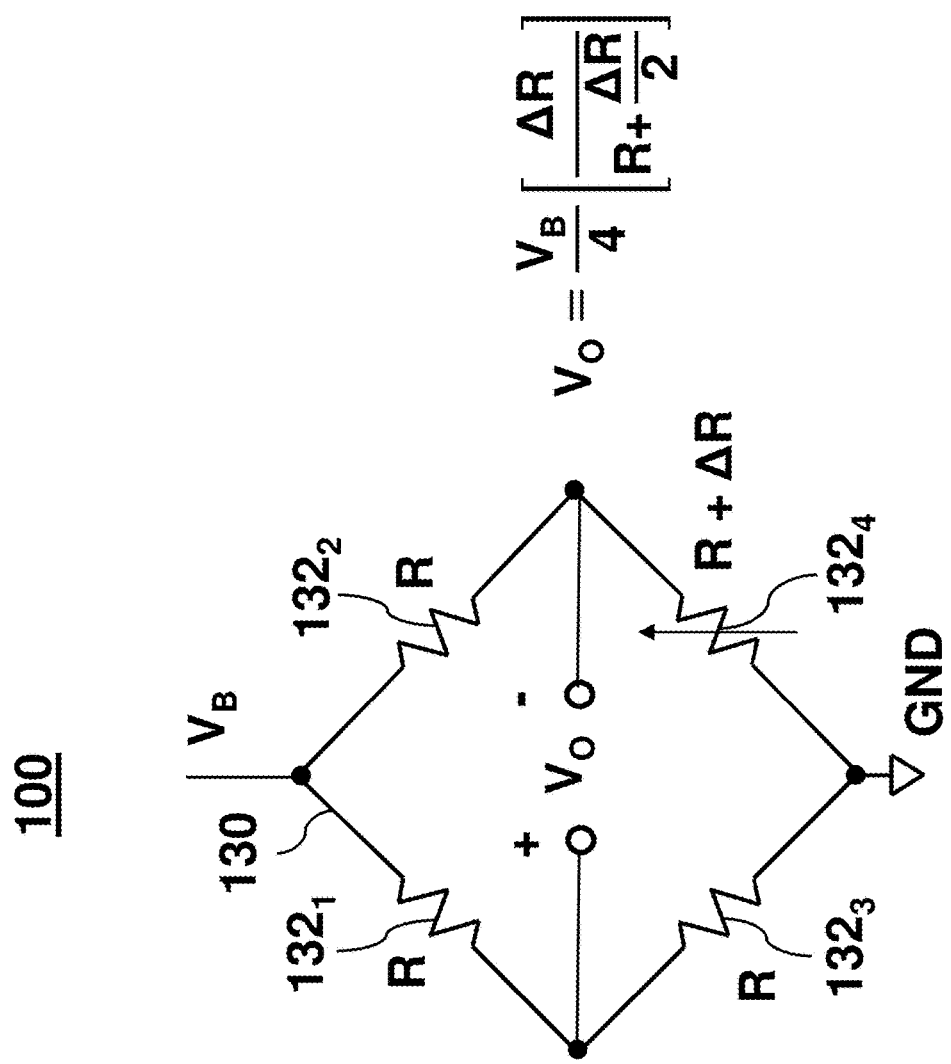
FIG. 3 is a circuit diagram illustrating an example reverse bridge of the example system of FIG. 1 according to a second embodiment.

With reference now to FIG. 3, in another embodiment of reverse bridge 130, a bridge arrangement may be utilized in which the resistance of resistor 132₁ is R, the resistance of resistor 132₂ is R, the resistance of resistor 132₃ is R and the resistance of resistor 132₄ is R+ΔR. In this embodiment, $V_O$ may be determined according to equation (2) below:

$$V_O = \frac{V_B}{4}\left[\frac{\Delta R}{R + \frac{\Delta R}{2}}\right] \quad (2)$$

As seen in equation (2), as $V_B$ changes, the output $V_O$ also changes while resistance R and ΔR are held constant with a fixed ratio of ΔR/(R+ΔR/2).

Figure 4:
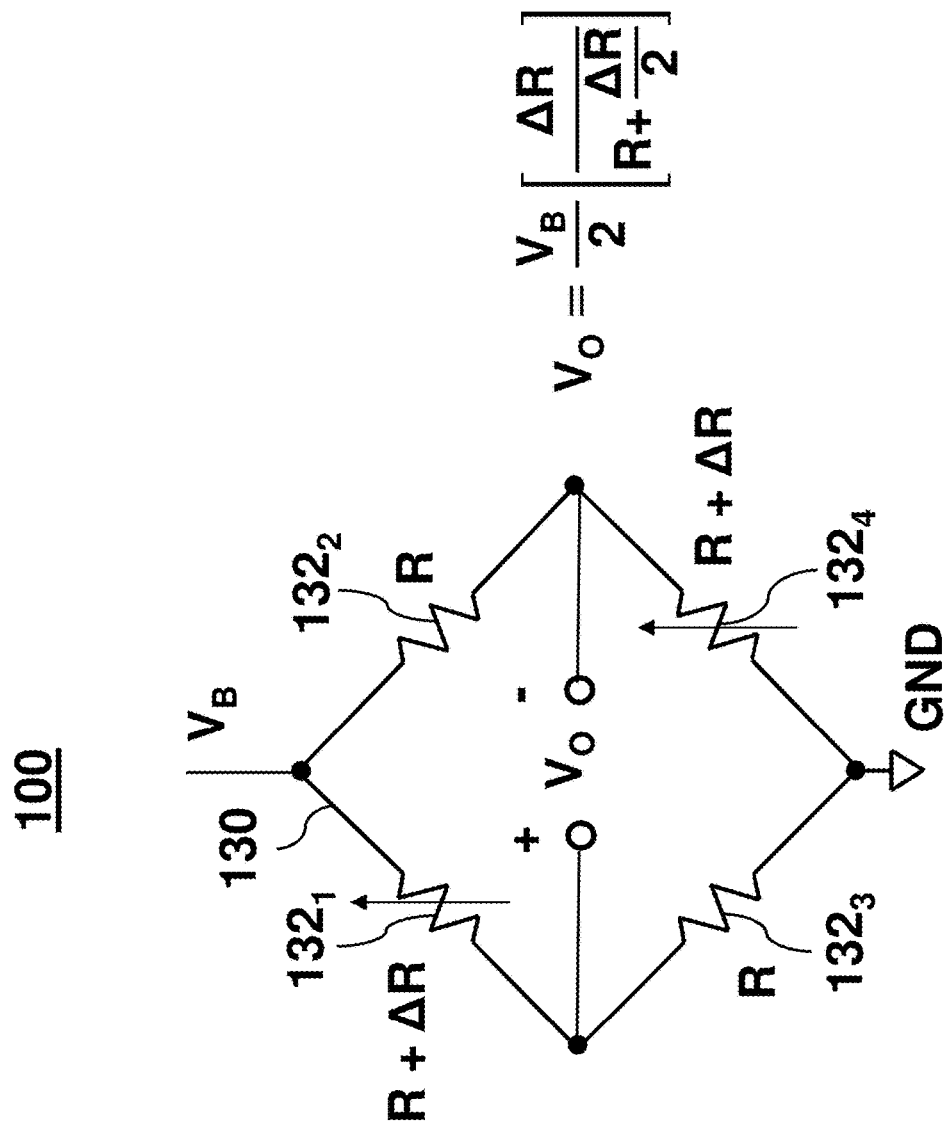
FIG. 4 is a circuit diagram illustrating an example reverse bridge of the example system of FIG. 1 according to a third embodiment.

With reference now to FIG. 4, in another embodiment of reverse bridge 130, a bridge arrangement may be utilized in which the resistance of resistor 132₁ is R+ΔR, the resistance of resistor 132₂ is R, the resistance of resistor 132₃ is R and the resistance of resistor 132₄ is R+ΔR. In this embodiment, $V_O$ may be determined according to equation (3) below:

$$V_O = \frac{V_B}{2}\left[\frac{\Delta R}{R + \frac{\Delta R}{2}}\right] \quad (3)$$

As seen in equation (3), as $V_B$ changes, the output $V_O$ also changes while resistance R and ΔR are held constant with a fixed ratio of ΔR/(R+ΔR/2).

Figure 5:
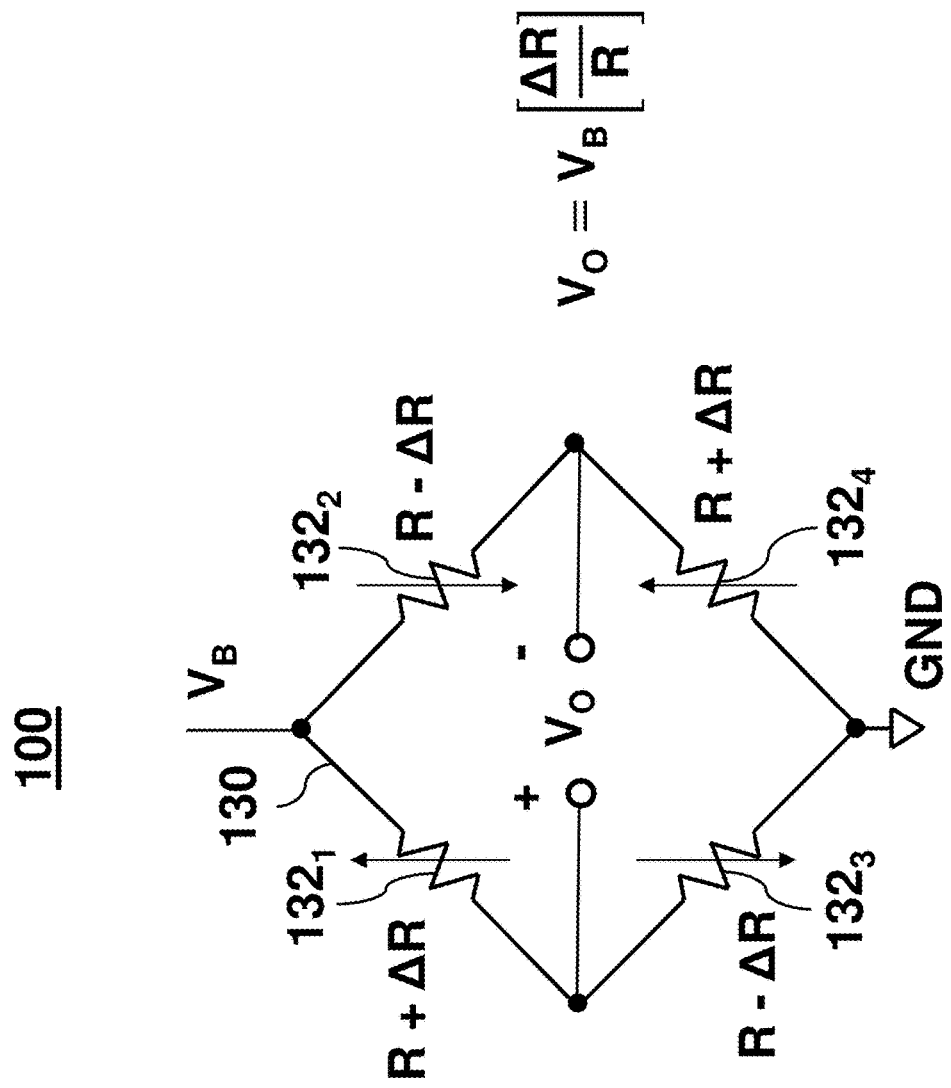
FIG. 5 is a circuit diagram illustrating an example reverse bridge of the example system of FIG. 1 according to a fourth embodiment.

With reference now to FIG. 5, in one embodiment of reverse bridge 130, a bridge arrangement may be utilized in which the resistance of resistor 132₁ is R+ΔR, the resistance of resistor 132₂ is R−ΔR, the resistance of resistor 132₃ is R−ΔR and the resistance of resistor 132₄ is R+ΔR. In this embodiment, $V_O$ may be determined according to equation (4) below:

$$V_O = V_B\left[\frac{\Delta R}{R}\right] \quad (4)$$

As seen in equation (4), as $V_B$ changes, the output $V_O$ also changes while resistance R and ΔR are held constant with a fixed ratio of ΔR/R.

In each of the embodiments of reverse bridge 130 shown in FIGS. 2-5, the resistance values of resistors 132₁, 132₂, 132₃ and 132₄ are held fixed while $V_O$ varies with $V_B$. Because $V_B$ will always be in a known range based on VDD, e.g., 0% VDD to 100% VDD in some embodiments, reverse bridge 130 may be easily fabricated to have a particular output format regardless of the sensor 110 being used and whether or not there are corrections to be made such as linearization, temperature correction or other adjustments to the differential voltage of outputs INP and INN of sensor 110. For example, for sensor 110 that measures fluid pressure between 0 mmHg and 300 mmHg and outputs a corresponding differential voltage with arbitrary sensitivity in a format of μV/VDDB−VSSB/mmHg or mV/VDDB−VSSB/mmHg, depending on its material and physical properties, with $V_B$ having a range of 0% VDD to 100% VDD, reverse bridge 130 may be configured to output $V_O$ in a format of 5 μV/VDD/mmHg or 40 μV/VDD/mmHg where $V_O$ is a conditioned, linearized, temperature corrected value that is rescaled to the output format by reverse bridge 130 in accordance with the expected format and range for presentation device 140.

In some embodiments, GND of reverse bridge 130 may be connected to a negative voltage source such that resistors 132₁, 132₂, 132₃ and 132₄ are connected between $V_B$ and the negative voltage source. In such a case, reverse bridge 130 may be configured to output a negative value for $V_O$ in the output format.

SSC 120 and reverse bridge 130 together allow signals output by sensor 110 to be conditioned and scaled to the target format for a presentation device 140 independent of the configuration or trimming of sensor 110. For example, SSC 120 is able to condition the differential voltage received from sensor 110 and convert that value into a $V_B$ output value within a predetermined range, e.g., 0% VDD to 100% VDD, that is proportionate to the measurement range of sensor 110, e.g., 0 mmHg to 300 mmHg in the example of a pressure sensor for a fluid measurement target 114. Because $V_B$ is within the predetermined range but still proportionate to the range of the property of measurement target 114 that is being measured, sensor 110 may be implemented in a manner that is independent from the interface requirements of presentation device 140 and whether or not sensor 110 is trimmed.

In addition, reverse bridge 130 may be implemented with fixed R and ΔR values as well as fixed ratios between ΔR and R such that the output $V_O$ is in a target format. Because of this, reverse bridge 130 may be configured to output $V_O$ in the target format for presentation device 140 independent of the configuration of sensor 110 where changes in the measured property are reflected by changes to $V_B$.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
a plurality of resistors arranged as a reverse bridge and being configured to convert an input voltage to a scaled output voltage, the scaled output voltage being scaled to a target format based at least in part on a range of the input voltage and a fixed value of the plurality of resistors, the input voltage being generated based at least in part on at least one signal generated by a sensor based at least in part on a measurement of a property of a measurement target,
wherein at least one of the plurality of resistors has a resistance value of R and at least another of the plurality of resistors has a resistance value of R plus or minus $\Delta R$.

2. The apparatus of claim 1, wherein the input voltage is generated by a sensor signal conditioning integrated circuit based at least in part on the at least one signal generated by the sensor.

3. The apparatus of claim 2, wherein the range of the input voltage is based at least in part on a supply voltage (VDD) of the sensor signal conditioning integrated circuit.

4. The apparatus of claim 3, wherein the target format comprises a target voltage value per VDD per unit of pressure (P).

5. The apparatus of claim 4, wherein the target format comprises one of:
5 microvolts ($\mu V$)/VDD/P; and
40 $\mu V$/VDD/P.

6. The apparatus of claim 1, wherein the plurality of resistors comprise four resistors, the four resistors comprising one of:
three resistors having a resistance value of R and one resistor having a resistance value of R+$\Delta R$;
two resistors having a resistance value of R and two resistors having a resistance value of R+$\Delta R$;
two resistors having a resistance value of R, one resistor having a resistance value of R+$\Delta R$ and one resistor having a resistance value of R−$\Delta R$; and
two resistors having a resistance value of R+$\Delta R$ and two resistors having a resistance value of R−$\Delta R$.

7. The apparatus of claim 1, wherein the fixed value of the plurality of resistors is one or more of a fixed value of R, a fixed value of $\Delta R$, a fixed ratio of $\Delta R/R$ and a fixed ratio of $\Delta R/(R+\Delta R/2)$.

8. The apparatus of claim 1, wherein the input voltage is connected to a first portion of the reverse bridge and a voltage source is connected to a second portion of the reverse bridge, the reverse bridge being configured to generate a negative scaled output voltage based at least in part on the connection of the second portion of the reverse bridge to the voltage source.

9. A system comprising:
a sensor signal conditioning integrated circuit, the sensor signal conditioning integrated circuit being configured to:
receive at least a first sensor signal and a second sensor signal from a sensor, the first and second sensor signals being generated by the sensor based at least in part on a measurement of a property of a measurement target; and
generate an input voltage based at least in part on a differential voltage between the first and second sensor signals, the input voltage having a range that is proportional to a measurement range the property of the measurement target that is being measured by the sensor; and a plurality of resistors arranged as a reverse bridge, the reverse bridge being configured to convert the input voltage to a scaled output voltage, the scaled output voltage being scaled to a target format based at least in part on the range of the input voltage and a fixed value of the plurality of resistors.

10. The system of claim 9, wherein:
the differential voltage between the first and second sensor signals is a nonlinear temperature dependent value generated as a function of the property of the measurement target being measured by the sensor; and
the sensor signal conditioning integrated circuit is configured to generate the input voltage based at least in part on a linearization of the first and second sensor signals.

11. The system of claim 9, wherein sensor signal conditioning integrated circuit is configured to receive a supply voltage (VDD) and the range of the input voltage is based at least in part on VDD.

12. The system of claim 11, wherein the target format comprises a target voltage value per VDD per unit of pressure (P).

13. The system of claim 12, wherein the target format comprises one of:
5 microvolts ($\mu V$)/VDD/P; and
40 $\mu V$/VDD/P.

14. The system of claim 9, wherein at least one of the resistors has a resistance value of R and at least another of the resistors has a resistance value of R plus or minus $\Delta R$.

15. The system of claim 14, wherein the plurality of resistors comprise four resistors, the four resistors comprising one of:
three resistors having a resistance value of R and one resistor having a resistance value of R+$\Delta R$;
two resistors having a resistance value of R and two resistors having a resistance value of R+$\Delta R$;
two resistors having a resistance value of R, one resistor having a resistance value of R+$\Delta R$ and one resistor having a resistance value of R−$\Delta R$; and
two resistors having a resistance value of R+$\Delta R$ and two resistors having a resistance value of R−$\Delta R$.

16. The system of claim 14, wherein the fixed value of the plurality of resistors is one or more of a fixed value of R, a fixed value of $\Delta R$, a fixed ratio of $\Delta R/R$ and a fixed ratio of $\Delta R/(R+\Delta R/2)$.

17. The system of claim 9, wherein the input voltage is connected to a first portion of the reverse bridge and a voltage source is connected to a second portion of the reverse bridge, the reverse bridge being configured to generate a negative scaled output voltage based at least in part on the connection of the second portion of the reverse bridge to the voltage source.

18. A system comprising:
a sensor signal conditioning integrated circuit, the sensor signal conditioning integrated circuit being configured to:
receive at least a first sensor signal and a second sensor signal from a sensor, the first and second sensor signals being generated by the sensor based at least in part on a measurement of a fluid pressure corresponding to a pressure monitor of a patient; and
generate an input voltage based at least in part on a differential voltage between the first and second sensor signals, the input voltage having a range that is proportional to a measurement range the fluid pressure that is being measured by the sensor; and a plurality of resistors arranged as a reverse bridge, the reverse bridge being configured to:
    convert the input voltage to a scaled output voltage, the scaled output voltage being scaled to a target format based at least in part on the range of the input voltage and a fixed value of the plurality of resistors; and
    provide the scaled output voltage to a presentation device.

19. The system of claim 18, wherein:
wherein at least one of the resistors has a resistance value of R and at least another of the resistors has a resistance value of R plus or minus $\Delta R$; and
the fixed value of the plurality of resistors is one or more of a fixed value of R, a fixed value of $\Delta R$, a fixed ratio of $\Delta R/R$ and a fixed ratio of $\Delta R/(R+\Delta R/2)$.

* * * * *